United States Patent
Wu et al.

(10) Patent No.: US 10,658,368 B2
(45) Date of Patent: May 19, 2020

(54) DYNAMIC RANDOM ACCESS MEMORY

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Wan-Chi Wu, Tainan (TW); Kai-Ping Chen, Tainan (TW); Hong-Ru Liu, Chiayi County (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 15/847,945

(22) Filed: Dec. 20, 2017

(65) Prior Publication Data

US 2019/0157277 A1 May 23, 2019

(30) Foreign Application Priority Data

Nov. 23, 2017 (CN) .......................... 2017 1 1184388

(51) Int. Cl.
*H01L 27/108* (2006.01)
(52) U.S. Cl.
CPC .. *H01L 27/10888* (2013.01); *H01L 27/10805* (2013.01); *H01L 27/10814* (2013.01)
(58) Field of Classification Search
CPC .................. H01L 27/10888; H01L 27/10805
See application file for complete search history.

(56) References Cited

U.S. PATENT DOCUMENTS

| | | | | |
|---|---|---|---|---|
| 5,812,444 A | * | 9/1998 | Ema | H01L 27/10808 257/E27.085 |
| 5,851,875 A | * | 12/1998 | Ping | H01L 27/10817 438/253 |
| 5,933,724 A | * | 8/1999 | Sekiguchi | H01L 27/10852 257/E21.648 |
| 7,349,232 B2 | | 3/2008 | Wang et al. | |
| 2005/0063214 A1 | * | 3/2005 | Takashima | G11C 11/22 365/145 |
| 2008/0277725 A1 | * | 11/2008 | Shino | H01L 21/84 257/347 |
| 2011/0108889 A1 | | 5/2011 | Xing et al. | |

OTHER PUBLICATIONS

Kai-Ping, Chen et al., "Advanced Design and Process in DRAM Manufacturing", Invention Disclosure, Dec. 8, 2016, p. 1-19.

* cited by examiner

*Primary Examiner* — Selim U Ahmed
(74) *Attorney, Agent, or Firm* — Winston Hsu

(57) ABSTRACT

A dynamic random access memory (DRAM) includes a first bit line extending along a first direction, a first buried word line extending along a second direction, and an active region overlapping part of the first bit line and part of the first buried word line. Preferably, the active region comprises a V-shape. Moreover, the DRAM also includes at least a storage node contact overlapping one end of the active region, in which the storage node contact includes an ellipse.

8 Claims, 5 Drawing Sheets

US 10,658,368 B2

DYNAMIC RANDOM ACCESS MEMORY

BACKGROUND OF THE INVENTION

1. Field of the Invention

The invention relates to a dynamic random access memory (DRAM), and more particularly to a DRAM having v-shaped active region.

2. Description of the Prior Art

As electronic products develop toward the direction of miniaturization, the design of dynamic random access memory (DRAM) units also moves toward the direction of higher integration and higher density. Since the nature of a DRAM unit with buried gate structures has the advantage of possessing longer carrier channel length within a semiconductor substrate thereby reducing capacitor leakage, it has been gradually used to replace conventional DRAM unit with planar gate structures.

Typically, a DRAM unit with buried gate structure includes a transistor device and a charge storage element to receive electrical signals from bit lines and word lines. Nevertheless, current DRAM units with buried gate structures still pose numerous problems due to limited fabrication capability. Hence, how to effectively improve the performance and reliability of current DRAM device has become an important task in this field.

SUMMARY OF THE INVENTION

According to an embodiment of the present invention, a dynamic random access memory (DRAM) includes: a first bit line extending along a first direction; a first buried word line extending along a second direction; and an active region overlapping part of the first bit line and part of the first buried word line. Preferably, the active region comprises a V-shape.

According to another aspect of the present invention, a dynamic random access memory (DRAM) includes: a first bit line extending along a first direction; a first buried word line extending along a second direction; an active region overlapping part of the first bit line and part of the first buried word line; and a first storage node contact overlapping one end of the active region. Preferably, the first storage node contact comprises an ellipse.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
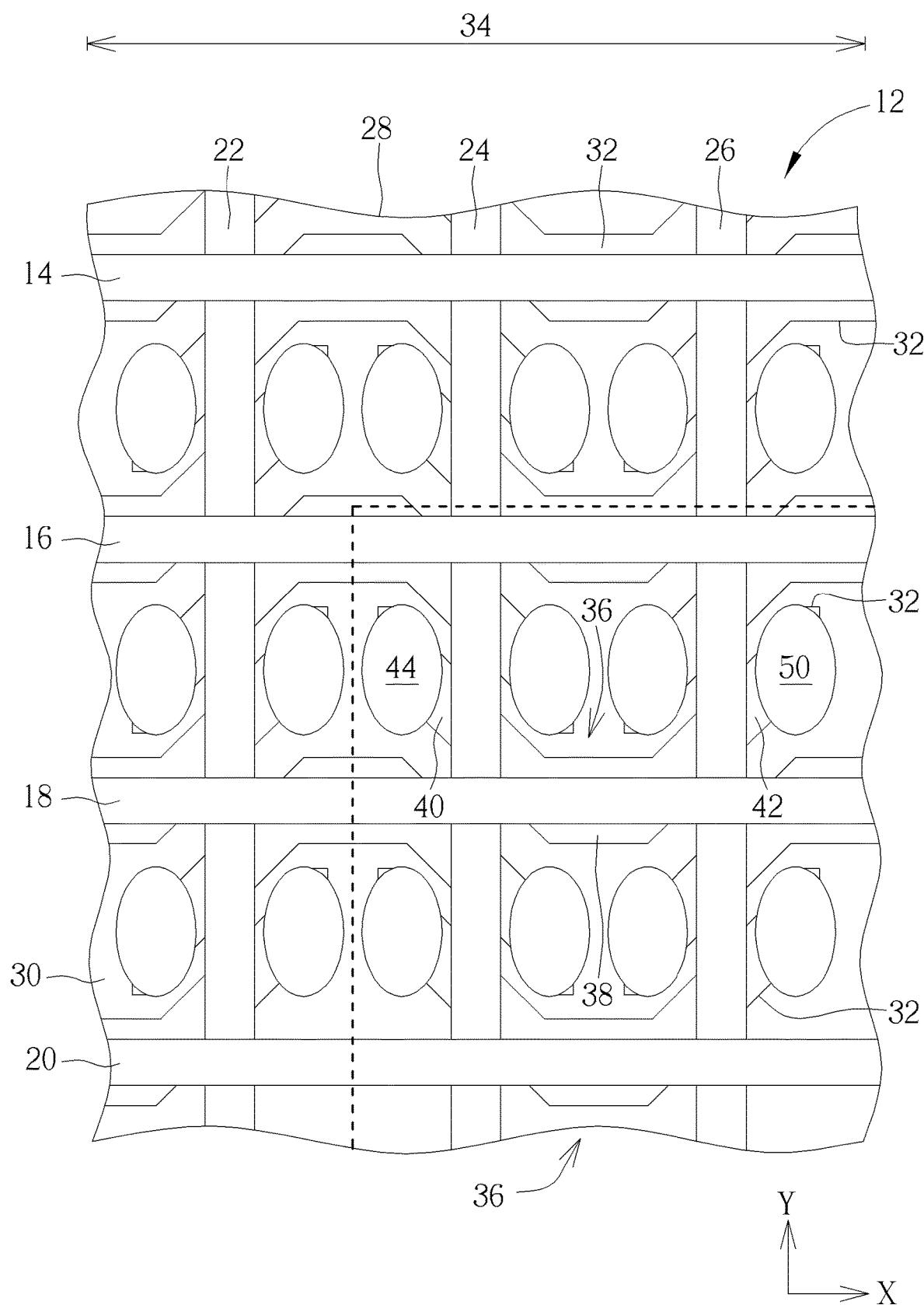
FIG. 1 illustrates a top-view of the DRAM device according to an embodiment of the present invention.
Figure 2:
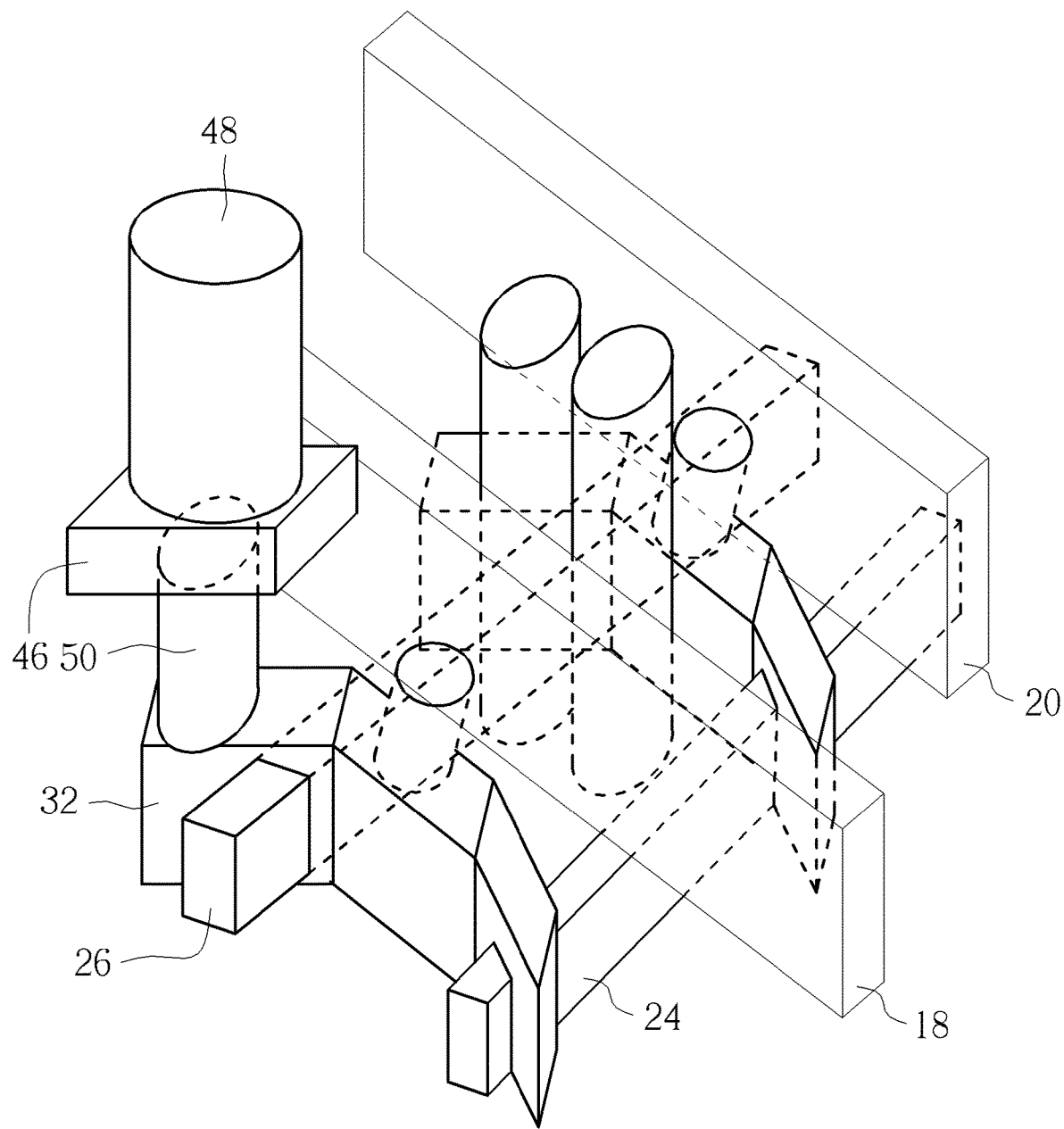
FIG. 2 illustrates a 3-dimensional view of the dotted region shown in FIG. 1.

Referring to FIGS. 1-2, FIGS. 1-2 illustrate structural views of a DRAM device according to an embodiment of the present invention, in which FIG. 1 illustrates a top-view of the DRAM device and FIG. 2 illustrates a 3-dimensional view of the dotted region shown in FIG. 1. As shown in FIGS. 1-2, the present embodiment pertains to a memory device, and more particularly a DRAM device 12 having buried gate lines, in which the DRAM device 12 includes at least a transistor device (not shown) and at least a capacitor structure (not shown) that will be serving as a smallest constituent unit within the DRAM array and also used to receive electrical signals from bit lines 14, 16, 18, 20 and buried word lines (BWL) 22, 24, 26.

As shown in FIG. 1, the DRAM device 12 includes a substrate 28 such as a semiconductor substrate or wafer made of silicon, a shallow trench isolation (STI) 30 formed in the substrate 28, and a plurality of active areas (AA) 32 defined on the substrate 28. A memory region 34 and a periphery region (not shown) are also defined on the substrate 28, in which multiple bit lines 14, 16, 18, 20 and multiple buried word lines 22, 24, 26 are preferably formed on the memory region 34 while other active devices (not shown) could be formed on the periphery region. For simplicity purpose, only devices or elements on the memory region 34 are shown in FIG. 1 while elements on the periphery region are omitted.

In this embodiment, each of the bit lines 14, 16, 18, 20 are disposed extending along a first direction such as x-direction, each of the buried word lines 22, 24, 26 are disposed extending along a second direction orthogonal to the first direction such as y-direction, and each of the active regions 32 overlap part of the bit lines 14, 16, 18, 20 and part of the buried word lines 22, 24, 26 at the same time, in which each of the active regions 32 further includes a V-shape 36 or V-shaped profile.

For instance, the active region 32 disposed between the bit lines 16, 18 while overlapping the buried word lines 24, 26, and the bit line 18 preferably includes a V-shape 36 or V-shaped profile, in which the V-shape 36 further includes a first portion 38 extending along the x-direction, a second portion 40 extending along a third direction, and a third portion 42 extending along a fourth direction. In this embodiment, the first portion 38 is extending along the same direction as the bit line 18 while overlapping the bit line 18 completely. The second portion 40 and the third portion 42 on the other hand are disposed adjacent to two sides of the first portion 38, in which the second portion 40 disposed on the left side of the first portion 38 preferably overlaps the buried word line 24 on the left side of the first portion 38, the third portion 42 disposed on the right side of the first portion 38 overlaps the buried word line 26 on the right side of the first portion 38, and the first portion 38, the second portion 40, and the third portion 42 constitute a V-shape 36 or V-shaped profile altogether.

Viewing from a more detailed perspective, as shown in FIGS. 1-2, the two ends of the active region 32 are preferably electrically connected to storage node pads and upper level storage node contacts through lower level storage node contacts. For instance, the end of the second portion 40 is connected to storage node pad and upper level storage node contact through lower level storage node contact 44, and the end of the third portion 42 is connected to storage node pad 46 and upper level storage node contact 48 through another lower level storage node contact 50. Preferably, the storage node contact 44 overlaps part of the second portion 40, the storage node contact 50 overlaps part of the third portion 42, and each of the storage node contact 44 connected to the end of second portion 40 and the storage node contact 50 connected to the end of third portion 42 reveals an ellipse or elliptical shape when viewed from the top. It should be noted that for simplicity purpose part of the elements were omitted in the 3-dimensional structure shown in FIG. 2. For instance, only the storage node contacts and upper elements connected to one end of the active region 32 were shown.

Figure 3:
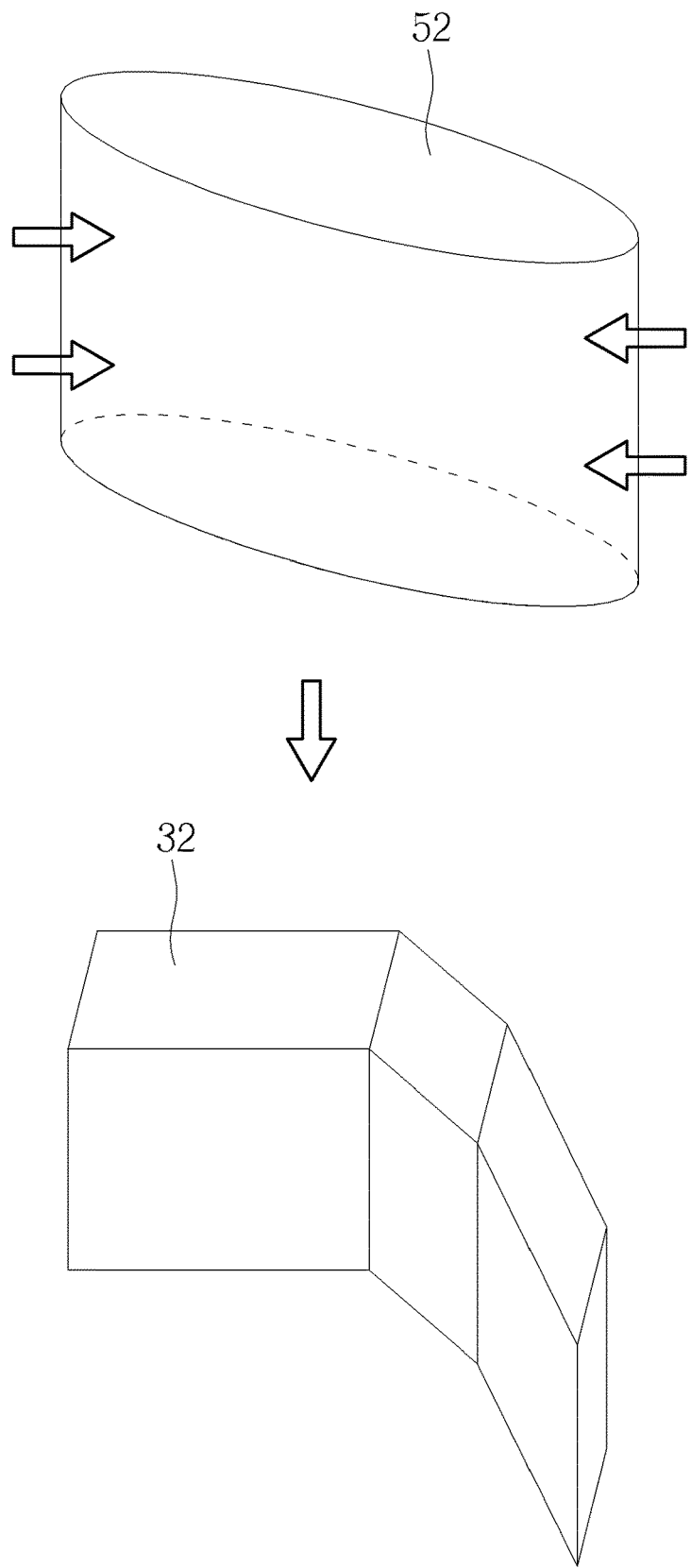
FIG. 3 illustrates a 3-dimensional comparative diagram between an active region of a conventional DRAM device and an active region of the DRAM device of the present invention.

Overall, the DRAM device of this embodiment includes following advantages:

1. Referring to FIG. 3, FIG. 3 illustrates a 3-dimensional comparative diagram between an active region of a conventional DRAM device and an active region of the DRAM device of the present invention, in which the active region 52 on the top reveals an active region from a conventional DRAM device while the active region 32 on the bottom reveals an active region from the present invention. As shown in FIG. 3, in contrast to the conventional active region 52 of having elliptical and cylindrical structure overall thereby having a higher likelihood of collapsing when outside forces were exerted on the structure, the 3-dimensional V-shape structure of the active region 32 of the present invention provides a much higher strength and stability when outside forces were applied on the structure.

Figure 4:
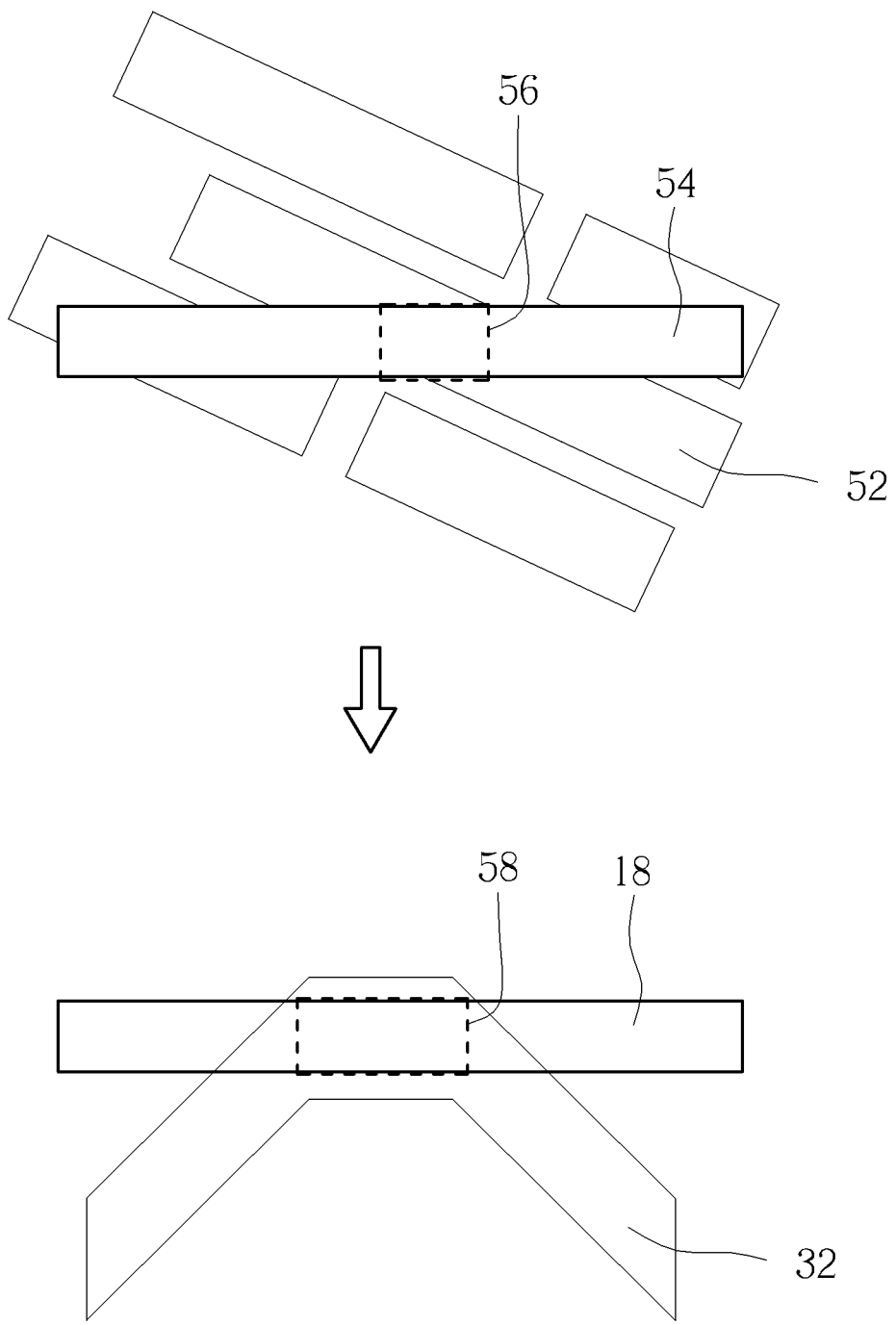
FIG. 4 illustrates a comparison between areas of bit line contact of a conventional DRAM device and bit line of the present invention.

2. Referring to FIG. 4, FIG. 4 illustrates a comparison between areas of bit line contact of a conventional DRAM device and bit line of the present invention, in which the top portion of FIG. 4 reveals a bit line contact from conventional DRAM and the bottom portion reveals a bit line contact from present invention. As shown in FIG. 4, in contrast to the bit line 54 extending along a direction different from the active region 52 so that the bit line contact 56 would have smaller coverage area in conventional art, at least part of the active region 32, such as the first portion 38 disclosed in the aforementioned embodiment is extending the same direction as the bit line 18 so that the overall coverage area of the bit line contact 58 in present invention could be increased substantially thereby lowering resistance of the device.

Figure 5:
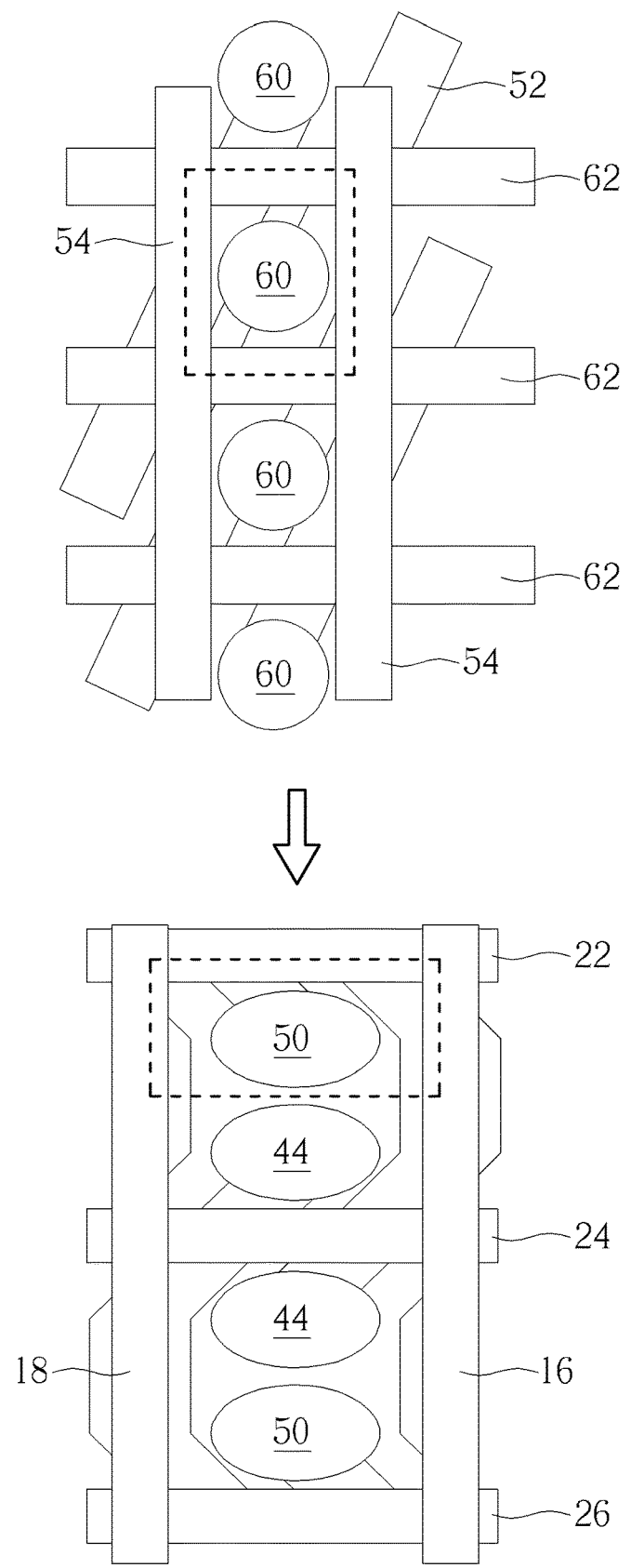
FIG. 5 illustrates a spatial comparison between conventional DRAM device and DRAM device of the present invention under one transistor one contact (1T1C) architecture.

3. Referring to FIG. 5, FIG. 5 illustrates a spatial comparison between conventional DRAM device and DRAM device of the present invention under one transistor one contact (1T1C) architecture, in which the top portion reveals a top view of a conventional DRAM device and the bottom portion reveals a top view of the DRAM device of the present invention. As shown in FIG. 5, in contrast to the storage node contacts 60 in the conventional structure being too close to the adjacent bit lines 54 and buried word lines 62 under 1T1C architecture (such as the range marked by the dotted lines shown in FIG. 5), the structure of the present invention under 1T1C architecture provides much more available space between storage node contacts 50 and adjacent bit lines 16, 18 so that parasitic capacitance could be minimized.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A dynamic random access memory (DRAM), comprising:
   a first bit line extending along a first direction;
   a first buried word line extending along a second direction; and
   an active region overlapping part of the first bit line and part of the first buried word line, wherein the active region comprises a V-shape, wherein the V-shape comprises:
      a first portion extending along the first direction, wherein the first portion comprises a first side and a second side extending along the first direction and the first portion overlaps the first bit line without overlapping any of the first buried word line;
      a second portion extending along a third direction; and
      a third portion extending along a fourth direction.

2. The DRAM of claim 1, further comprising:
   a second bit line extending along the first direction adjacent to the first bit line; and
   a second buried word line extending along the second direction adjacent to the first buried word line.

3. The DRAM of claim 2, wherein the active region overlaps part of the first bit line, part of the first buried word line, and part of the second buried word line.

4. The DRAM of claim 2, wherein the second portion overlaps the first buried word line and the third portion overlaps the second buried word line.

5. The DRAM of claim 1, further comprising a first storage node contact overlapping the second portion and a second storage node contact overlapping the third portion.

6. A dynamic random access memory (DRAM), comprising:
   a first bit line extending along a first direction;
   a first buried word line extending along a second direction;
   a second bit line extending along the first direction immediately adjacent to the first bit line;
   a second buried word line extending along the second direction immediately adjacent to the first buried word line;
   an active region overlapping part of the first bit line and part of the first buried word line;
   a first storage node contact overlapping one end of the active region, wherein the first storage node contact comprises an ellipse without overlapping the first buried word line; and
   a second storage node contact overlapping another end of the active region, wherein the first storage node contact and the second storage node contact are surrounded by the first bit line, the first buried word line, the second bit line, and the second buried word line.

7. The DRAM of claim 6, wherein the active region overlaps part of the first bit line, part of the first buried word line, and part of the second buried word line.

8. The DRAM of claim 6, wherein the second storage node comprises an ellipse.

* * * * *